United States Patent
Clifton

(10) Patent No.: US 7,612,365 B2
(45) Date of Patent: Nov. 3, 2009

(54) STRAINED SILICON WITH ELASTIC EDGE RELAXATION

(75) Inventor: Paul A. Clifton, Mountain View, CA (US)

(73) Assignee: Acorn Technologies, Inc., Santa Monica, CA (US)

( * ) Notice: Subject to any disclaimer, the term of this patent is extended or adjusted under 35 U.S.C. 154(b) by 87 days.

(21) Appl. No.: 12/036,969

(22) Filed: Feb. 25, 2008

(65) Prior Publication Data

US 2008/0213962 A1 Sep. 4, 2008

Related U.S. Application Data

(62) Division of application No. 11/378,730, filed on Mar. 17, 2006, now Pat. No. 7,338,834.

(51) Int. Cl.
*H01L 31/0336* (2006.01)
*H01L 21/00* (2006.01)

(52) U.S. Cl. .......................... 257/19; 438/95
(58) Field of Classification Search .................. 438/47, 438/95, 172, 191; 257/18–19
See application file for complete search history.

(56) References Cited

U.S. PATENT DOCUMENTS

| | | | |
|---|---|---|---|
| 4,994,866 A | 2/1991 | Awano | |
| 6,406,973 B1 * | 6/2002 | Lee | ............................ 438/416 |
| 6,492,216 B1 | 12/2002 | Yeo et al. | |
| 6,498,359 B2 | 12/2002 | Schmidt et al. | |
| 6,600,170 B1 | 7/2003 | Xiang | |
| 6,881,635 B1 | 4/2005 | Chidambarrao et al. | |

(Continued)

FOREIGN PATENT DOCUMENTS

EP 1 231 643 A2 8/2002

(Continued)

OTHER PUBLICATIONS

S.C. Jain, H.E. Maes, K. Pinardi, and I. De Wolf, "Stresses and Strains in Lattice-Mismatched Stripes, Quantum Wires, Quantum Dots, and Substrates in Si Technology", American Institute of Physics. 79 (11), Jun. 1, 1996.

(Continued)

*Primary Examiner*—Calvin Lee
(74) *Attorney, Agent, or Firm*—Orrick Herrington & Sutcliffe, LLP

(57) ABSTRACT

A thin blanket epitaxial layer of SiGe is grown on a silicon substrate to have a biaxial compressive stress in the growth plane. A thin epitaxial layer of silicon is deposited on the SiGe layer, with the SiGe layer having a thickness less than its critical thicknesses. Shallow trenches are subsequently fabricated through the epitaxial layers, so that the strain energy is redistributed such that the compressive strain in the SiGe layer is partially relaxed elastically and a degree of tensile strain is induced to the neighboring layers of silicon. Because this process for inducing tensile strain in a silicon over-layer is elastic in nature, the desired strain may be achieved without formation of misfit dislocations.

25 Claims, 10 Drawing Sheets

U.S. PATENT DOCUMENTS

| | | |
|---|---|---|
| 7,019,326 B2 | 3/2006 | Cea et al. |
| 7,138,310 B2 * | 11/2006 | Currie et al. ............... 438/199 |
| 2004/0021179 A1 | 2/2004 | Lee et al. |
| 2004/0026765 A1 | 2/2004 | Currie et al. |
| 2005/0093021 A1 | 5/2005 | Ouyang et al. |
| 2005/0106792 A1 | 5/2005 | Cea et al. |
| 2005/0133817 A1 | 6/2005 | Huang et al. |

FOREIGN PATENT DOCUMENTS

| | | |
|---|---|---|
| EP | 1 231 643 A3 | 10/2004 |

OTHER PUBLICATIONS

H. Yin, K.D. Hobart and F.J. Kub, S.R. Shieh and T.S. Duffy, J.C. Sturm, "Strain Partition of Si/SiGe and $SiO_2$/SiGe on Compliant Substrates," American Institute of Physics, Appl. Phys., Jun. 2, 2003.

A. Fisher and H. Richter, "Elastic Misfit Stress Relaxation in Heteroepitaxial SiGe/Si Mesa Structures," 1992 American Institute of Physics, Appl. Phys. Lett 61(22), Nov. 30, 1992.

Hirohisa Kawasaki, et al., "Impact of Parasitic Resistance and Silicon Layer Thickness Scaling for Strained-Silicon MOSFETs on Relaxed $Si_{1-x}Ge_x$ Virtual Substrate,", 2004 IEEE.

PCT Search Report and Written Opinion dated Sep. 28, 2007.

* cited by examiner

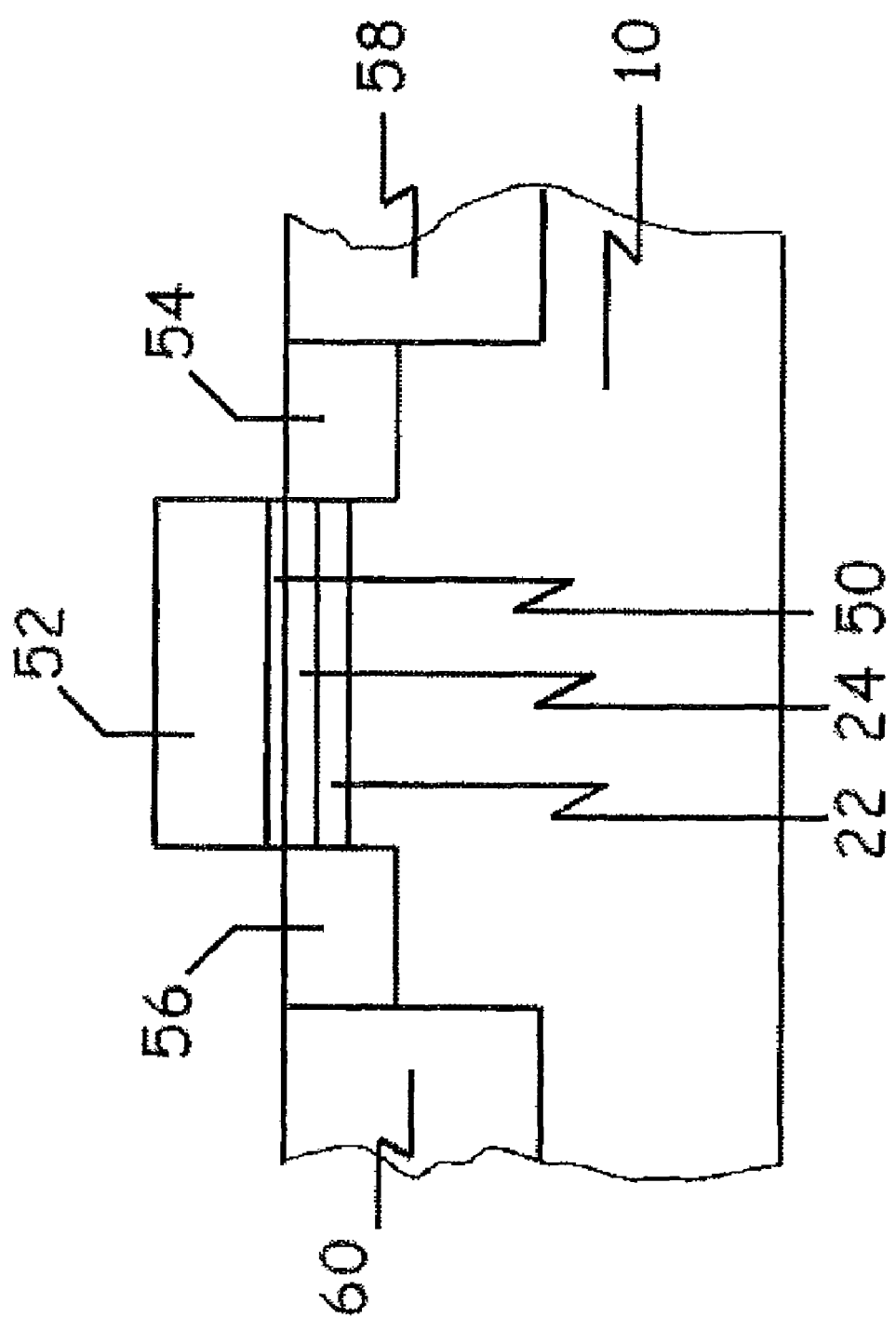

STRAINED SILICON WITH ELASTIC EDGE RELAXATION

CROSS-REFERENCE TO RELATED APPLICATIONS

This application is a divisional of application Ser. No. 11/378,730, filed on Mar. 17, 2006 now U.S. Pat. No. 7,338,834. The entire contents of the listed application is incorporated herein by reference.

BACKGROUND OF THE INVENTION

1. Field of the Invention

The present invention relates to stressed and strained layers in multilayer heterostructures containing silicon and germanium and more specifically relates to MOS devices formed in such heterostructures.

2. Description of the Related Art

Strained silicon is widely viewed as an important technology for obtaining desired advancements in integrated circuit performance. Biaxial, in-plane, tensile strained silicon exhibits enhanced in-plane electron and hole mobilities leading to improved n-channel and p-channel MOS field effect transistor (FET) performance relative to unstrained silicon. Mobility enhancement results from a combination of reduced effective carrier mass and reduced intervalley (phonon) scattering.

Strained silicon is conventionally obtained by first growing a thick layer of silicon germanium alloy (SiGe) on a silicon substrate. The SiGe layer is grown to a sufficient thickness that the SiGe layer is relaxed to an unstrained condition at its surface. The in-plane lattice parameter of the SiGe surface is similar to that of a bulk crystal of SiGe of the same composition. SiGe alloys have larger lattice parameters than silicon. Hence the relaxed surface of the SiGe layer provides an in-plane lattice parameter larger than that of silicon. A subsequent thin layer of silicon is grown epitaxially on the relaxed surface of the SiGe layer. The thin epitaxial layer of silicon assumes the larger in-plane lattice parameter of the SiGe and grows in a strained state with bonds in the crystal lattice elongated in the growth plane. This approach, sometimes known as substrate-strained silicon or "virtual substrate" technology, grows a thin pseudomorphic layer of silicon on the relaxed surface of a SiGe layer.

The specific in-plane lattice parameter of the relaxed SiGe is a function of its composition (atomic germanium fraction or mole fraction) and the degree of relaxation achieved (ideally 100%). Silicon and germanium have lattice parameters of 5.43 Å and 5.66 Å respectively and, according to Vegard's law, SiGe has a lattice parameter linearly interpolated between these values in proportion to the atomic germanium fraction in its composition. A thin layer of silicon grown epitaxially on the SiGe surface adopts the larger in-plane lattice spacing (the epitaxial growth is pseudomorphic) and hence is under in-plane tensile strain. Ideally, the strained silicon and relaxed SiGe lattices are coherent at their interface and there is an absence of misfit dislocations at that interface. Due to tetragonal distortion, the silicon layer grown on the SiGe layer exhibits a reduced lattice spacing in the orthogonal, out-of-plane direction.

So long as the strained silicon layer does not exceed a "critical thickness" for strain relaxation and some care is taken, the tensile strain is maintained in the strained silicon layer through the various implantation and thermal processing steps typical of CMOS manufacturing.

Strained SiGe has also been widely researched as a channel layer for enhanced mobility p-channel MOS transistors. In-plane hole mobility is significantly improved in a layer of SiGe that is compressively strained in-plane. However, despite much work on SiGe p-channel MOSFETs, such devices have not been introduced to CMOS manufacturing, at least in part due to the difficulty of forming a device quality gate oxide on a layer of SiGe. One approach to resolving this issue is to overlay the SiGe with a thin layer of silicon of sufficient thickness to avoid germanium contamination of the gate oxide interface yet sufficiently thin to minimize the additional contribution to effective gate oxide thickness.

Use of a strained SiGe layer also is known in the semiconductor industry as a method of forming the base layer in npn heterojunction base transistors (HBTs). In HBTs, the purpose of the SiGe base layer is to enhance the emission of minority carriers (electrons) from the emitter into the base. The consequential improvement in emitter efficiency leads to increased current gain and unity gain cut-off frequency ($f_T$) for high frequency (RF) applications. In bipolar transistors with graded SiGe base layers, performance is improved by the built in drift field which reduces the base transit time, leading to improved $f_T$. Any improvement in hole mobility in the p-type SiGe base layer of an npn HBT is of secondary importance to the transistor performance but is likely to be of some benefit in reducing base resistance and hence increasing the RF unity power gain frequency $f_{max}$.

The use of relaxed SiGe as a "virtual substrate" to strain a subsequently deposited epitaxial silicon layer inevitably requires acceptance of a very high dislocation density in the SiGe layer because the SiGe relaxation mechanism is plastic in nature. In other words, relaxation in the SiGe layer occurs through the generation of strain-relieving misfit dislocations. A thin SiGe layer on a silicon substrate is not relaxed and exhibits few misfit dislocations. If the SiGe layer is thicker than the "critical thickness," the strained lattice undergoes plastic deformation and the stress is relieved by the nucleation and propagation of misfit dislocations. Some fraction of misfit dislocations give rise to threading dislocations (at least $10^4$-$10^5$ cm$^{-2}$) which propagate through the overlying strained silicon layer. One current technology, used commercially by Amberwave Systems Corp. of Salem, N.H., grows a thick (thicker than one micron) SiGe layer of graded (increasing) germanium fraction, planarizes the resulting SiGe surface by chemical mechanical polishing (CMP) and grows a thin layer of SiGe of constant composition before it grows the final pseudomorphic strained silicon layer. Growing the layer of constant composition SiGe over the dislocated SiGe layer is intended to localize the misfit dislocations to the deeper SiGe layer. To date this strategy has failed to eliminate propagation of threading dislocations into the subsequently grown strained silicon layer. Threading dislocations represent extended defects and give rise to multiple undesirable consequences in MOSFETs including source/drain junction leakage, reduction of channel mobility, variability of threshold voltage and enhanced diffusion paths leading to potential drain-to-source shorting in short-channel MOSFETs.

The thick SiGe layer used in the "virtual substrate" technology has a much lower thermal conductivity than silicon. As a result, strained silicon MOSFETs on relaxed SiGe virtual substrates exhibit self heating effects similar to silicon on insulator (SOI) devices. Self heating has deleterious consequences for MOSFET performance such as increased off-state leakage current and mobility reduction leading to reduced drive current.

A thick relaxed SiGe layer tends to have poor surface morphology on which to grow a thin active layer of silicon (which will host the MOSFET channels). This has led to introduction of a CMP step to re-establish a planar surface, adding to cost of virtual substrate production.

The growth of a thick layer (for example, 2-3 microns) of graded SiGe, as used in forming strained silicon substrates according to the conventional process, has significant cost overhead. In addition, because of the degradation of surface morphology inherent in growing a thick plastically relaxed layer, a CMP step is required followed by another epitaxial growth cycle to form a thin, buffer SiGe layer and the final strained silicon layer. The preferred strategies described below with reference to the invention can avoid the costs of forming a thick graded SiGe layer and performing a CMP step. This should represent a 80-90% reduction in substrate processing costs.

SUMMARY OF THE PREFERRED EMBODIMENTS

One aspect of the present invention provides a semiconductor device with a plurality of n-channel MOSFETs formed on a substrate. The substrate comprises silicon. Each of the n-MOSFET devices comprises a first layer comprising germanium formed over the substrate. The first layer has a thickness less than a first thickness at which misfit dislocations form in the first layer. The first layer has a first lower interface lattice spacing matched with a substrate interface lattice spacing characteristic of an interface region of the substrate. A second layer comprising silicon is formed over the first layer and the second layer has a second lower interface lattice spacing matched with a first layer upper interface lattice spacing characteristic of an upper interface of the first layer. A gate dielectric layer is provided on the second layer and separates the second layer from a gate electrode. A concentration of germanium in the first layer is greater than a concentration of germanium in the second layer. The first layer and the second layer have a lateral extent such that the second layer exhibits lateral tensile strain over the lateral extent.

Another aspect of the present invention provides a semiconductor device that includes at least one n-channel MOSFET. The semiconductor device includes a substrate comprising silicon and having first and second walls of one or more shallow trench isolation structures extending partially into the substrate. A substrate interface region extends between the first and second walls. A first layer comprising germanium is provided on the substrate interface region and extends for a first spacing between the first and second walls. The first layer has a thickness less than a first thickness at which misfit dislocations form in the first layer due to a lattice mismatch between the substrate and the first layer. A second layer comprising silicon is formed on the first layer and extends between the first and second walls. A gate dielectric layer on the second layer separates the second layer from a gate electrode so that the second layer provides at least a part of a channel of an n-channel MOSFET device. A concentration of germanium in the first layer is greater than a concentration of germanium in the second layer so that the first layer induces a strain in the substrate interface region and in the second layer.

Another aspect of the present invention provides a method of manufacturing a semiconductor device by forming a first layer comprising germanium over a substrate. The first layer comprises germanium at a greater concentration than the substrate, has compressive stress as formed and has a thickness smaller than a first thickness at which plastic deformation occurs in the first layer. The method forms a second layer comprising silicon over the first layer, the first layer comprising germanium at a higher concentration than the second layer. Etching through the second layer and the first layer and into the substrate in a pattern defined by a mask layer and decoupling the mask layer from the second layer so as to allow the first layer to expand laterally, thereby straining the second layer between walls of one or more trenches formed in the etching process. A gate dielectric layer and a gate on the second layer are formed to provide a MOS device.

BRIEF DESCRIPTION OF THE DRAWINGS

FIG. 10 illustrates a MOS device according to preferred embodiments of the present invention.

DETAILED DESCRIPTION OF THE PREFERRED EMBODIMENTS

Figure 1:
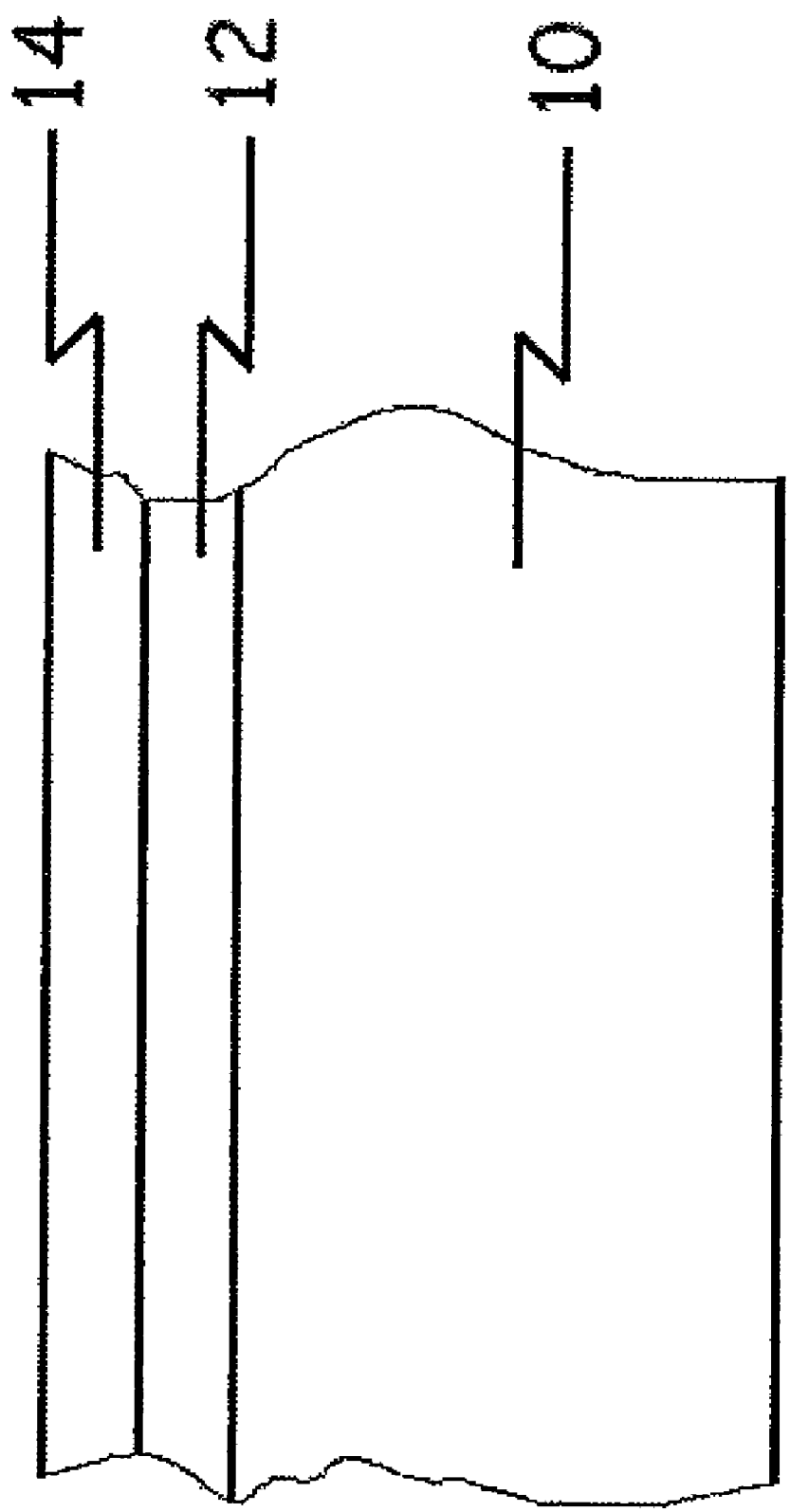
FIG. 1 shows schematically a heterostructure wafer according to an aspect of the present invention.

In-plane tensile strain may be induced in a layer of silicon by growing it on top of a layer of compressively strained silicon germanium (SiGe) alloy and subsequently etching isolation trenches through the silicon and SiGe layers in a manner that allows release of at least a portion of the compressive strain from the SiGe layer.

According to a preferred aspect of the present invention, implementations of the present invention may provide a tensile strained silicon layer suitable for the fabrication of high performance MOSFETs. A preferred process forms a blanket SiGe layer on a silicon substrate so that the SiGe layer has a thickness of a predetermined level or smaller so that the formed SiGe layer adopts the in-plane lattice spacing of the silicon substrate. The resulting SiGe layer is under compressive strain so long as the predetermined thickness of the layer does not exceed the thickness that leads to generation of misfit dislocations. An exemplary predetermined thickness for a SiGe layer having 30% germanium is about 30 nm. Because the SiGe layer is not relaxed it is essentially dislocation-free. A preferred process continues by forming a thin layer of epitaxial silicon over the compressively strained, un-relaxed SiGe layer. The epitaxial silicon layer is unstrained as formed because the in-plane lattice spacing of the un-relaxed SiGe layer is the same as that of the underlying silicon substrate. Subsequent processing relaxes the SiGe layer and consequently strains the epitaxial silicon layer.

According to another preferred aspect of the present invention, a layered (laminated) semiconductor wafer consisting of a thin blanket layer of silicon (4 nm-20 nm) on a thin blanket layer of SiGe (10 nm-40 nm) on a silicon bulk substrate is prepared by standard epitaxial techniques. The process then etches shallow trenches according to a "shallow trench isolation" (STI) process. The trenches define device active regions, including channels of MOSFETs, in the epitaxial surface silicon layer. Most preferably, the trenches are positioned so that the active regions have a lateral extent, such as the MOSFET width, that is sufficiently small that relaxation can occur across the entire lateral extent of the SiGe layer between the trenches. As soon as the trenches are cut, and without further treatment, the compressive strain in the SiGe layer is able to partially relax, most advantageously in an elastic process, which induces substantial tensile strain in the epitaxial silicon layer. Those of ordinary skill in the art will appreciate that in many modern configurations, active device regions will be surrounded by a continuous set of interconnected trenches. Even though such a set of interconnected trenches can be viewed as a single trench, for clarity, the present discussion refers to the etched openings on opposite sides of an active region as different trenches.

The new boundary formed at the surface of the trench sidewall allows the SiGe layer to extend outwards and in so doing to induce a tensile strain in the neighboring silicon lattices above and below the SiGe layer. Thus an in-plane tensile component of strain may be obtained in the overlying silicon layer without the need for plastic relaxation of the SiGe layer. The tensile strain induced into the top silicon layer by this method may in general be non-uniform in its distribution but is of sufficient magnitude to improve the in-plane electron and hole mobilities to a desirable extent and hence to improve the electrical performance of MOS transistors having channels at least in part formed in the layer.

Currently prevalent shallow trench isolation processing technology uses a patterned silicon nitride layer as both a trench etch mask and as a polish stop layer for the chemical mechanical polishing process used to define the silicon oxide material used to fill the trench. The patterned nitride layer is separated from the substrate by a thermal oxide layer. The layer structure of thermal oxide and patterned nitride is comparatively rigid and can constrain the shape of the substrate on which it is formed. Consequently, in some preferred implementations, a process according to the present invention may decouple the patterned nitride layer from the underlying substrate so that the substrate is better able to deform and relax strain. This decoupling might, for example, be accomplished by removing the patterned nitride layer to allow relaxation. Alternately the patterned nitride layer might be formed on a layer of material that can be made compliant so that the surface of the substrate can deform and is substantially decoupled from the patterned nitride layer.

Preferred implementations of the present invention provide a silicon layer in a state of biaxial tensile strain without forming or using a thick layer of relaxed SiGe. Such implementations preferably grow a thin layer of pseudomorphic SiGe on a silicon substrate to a thickness less than a critical thickness, where the critical thickness is just larger than the largest thickness for which compressive strain is maintained in the SiGe layer on a silicon substrate. A thin layer of silicon is then grown on top of the strained SiGe layer so that the thin layer of silicon is nominally unstrained because the in-plane lattice spacing remains the same in the SiGe layer as in the underlying bulk silicon substrate. As grown, the heteroepitaxial strained layer system supports strain only in the embedded SiGe layer and there is essentially no generation of misfit dislocations (that is, all the heterointerfaces are coherent).

A particularly preferred aspect of the present invention induces a redistribution of the strain energy in the heteroepitaxial layer system by patterning and etching trenches through the layer stack. Part of the deformation energy held in the lattice of the SiGe layer is shared with the lattices of the adjacent (above and below) silicon layers at the instant the trench etch penetrates the layer boundaries. The SiGe layer preferably is made sufficiently thick to strain the overlying silicon layer to the desired extent after etching the trenches through the SiGe layer.

FIG. 1 illustrates a wafer processed according to certain preferred aspects of the present invention at an intermediate stage of processing. In FIG. 1, a silicon substrate 10 is provided having, for example, a thickness and diameter typical for integrated circuit manufacturing. Depending on the particular devices to be formed, the silicon substrate may have a high quality epitaxial silicon layer on its surface or may have a buried oxide layer near to but spaced away from the surface. These and other known variations are not illustrated here. A preferred process continues by depositing a layer 12 of silicon germanium on the surface of the silicon substrate. Layer 12 preferably has an atomic germanium fraction of between 15% and 100% and typically will have an atomic germanium fraction of between about 20% and 30%. Layer 12 is preferably formed to a sufficient thickness to be able to impart a strain to a later formed epitaxial silicon layer, with the layer thickness being at or smaller than the thickness at which that composition of silicon germanium relaxes plastically. For example, the process may form SiGe layer 12 to a thickness of 10 nm to 40 nm, although these end values might change for different values of atomic germanium fraction. There is further discussion of the maximum desired thickness, often referenced in the literature as a "critical thickness," below.

Following deposition of the silicon germanium layer 12, a preferred process deposits an epitaxial layer 14 on the surface of the silicon germanium layer 12 so that the layer is pseudomorphic with the underlying silicon germanium layer 12. As deposited, layer 14 is preferably not strained because the underlying silicon germanium layer is compressively strained and has the lattice spacing of the underlying silicon substrate. Preferably layer 14 is silicon without germanium to allow for the formation of high quality gate dielectrics on the layer 14 but layer 14 could be silicon germanium with a lower atomic germanium fraction than that of layer 12. In this alternative, the surface layer 14 preferably has an atomic germanium fraction of about 15%-100% lower than the atomic germanium fraction in the silicon germanium layer 12. Layer 14 is deposited to a thickness sufficient to form desired active layers such as the channel of n-channel MOSFET (n-MOSFET) transistors while still sufficiently small to be strained by the underlying SiGe layer 12. For example, the process may form layer 14 to a thickness of 4 nm to 20 nm.

Figure 2:
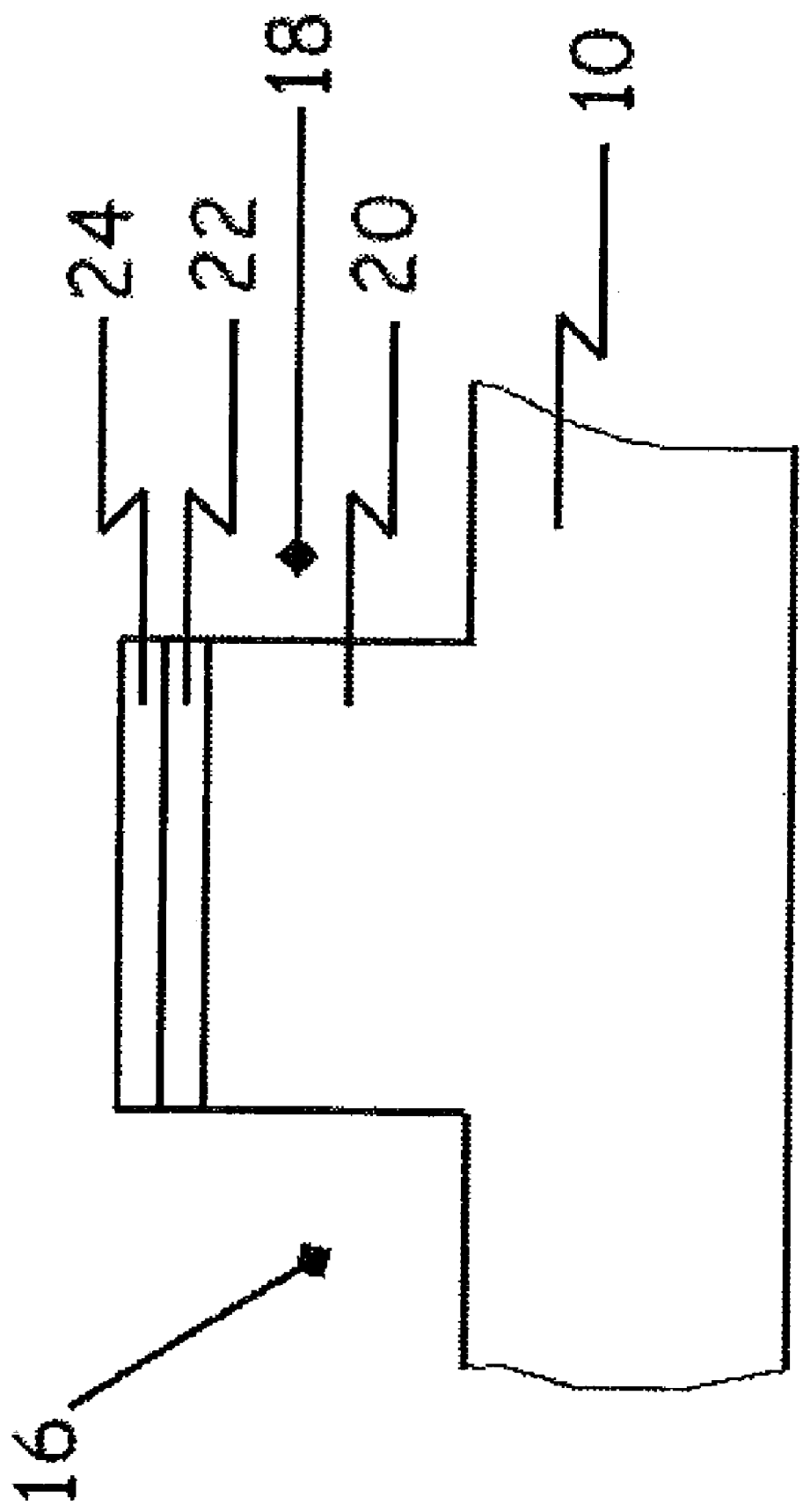
FIG. 2 shows schematically the wafer of FIG. 1 after further processing.

A preferred process continues by etching trenches 16, 18 through the layers 14 and 12 and into the substrate 10. The end result of this process is illustrated in FIG. 2. The illustrated trenches 16, 18 can be formed using the processing typically used for shallow trench isolation (STI) and preferably are formed to extend partially into the substrate 10. As noted above, the trenches may be different portions of a continuous network of trenches. The sidewalls of the trenches define a surface region 20 of the substrate, a SiGe layer 22 on the substrate surface region 20, and a strained surface silicon layer 24 on the SiGe layer 22. Each of the region 20, layer 22 and layer 24 extend between the sidewalls of trenches 16 and 18. As discussed above, etching the trenches most preferably allows the SiGe layer 22 to relax and to transfer a portion of its lattice strain energy into tensile stress within the silicon layer 24 above and the substrate surface region 20 below the etched SiGe layer 22.

Figure 3:
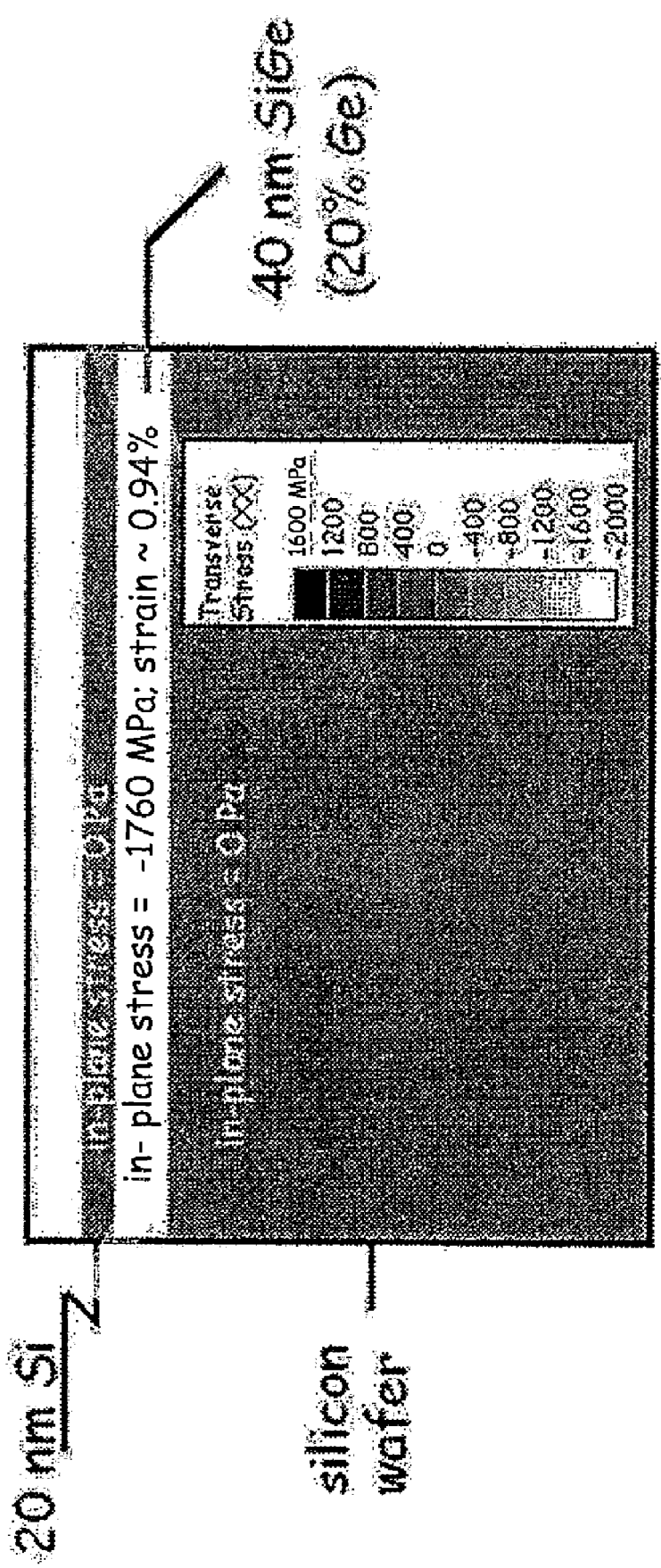
FIG. 3 shows the stress distribution for a heterostructure wafer consistent with that illustrated in FIG. 1.
Figure 4:
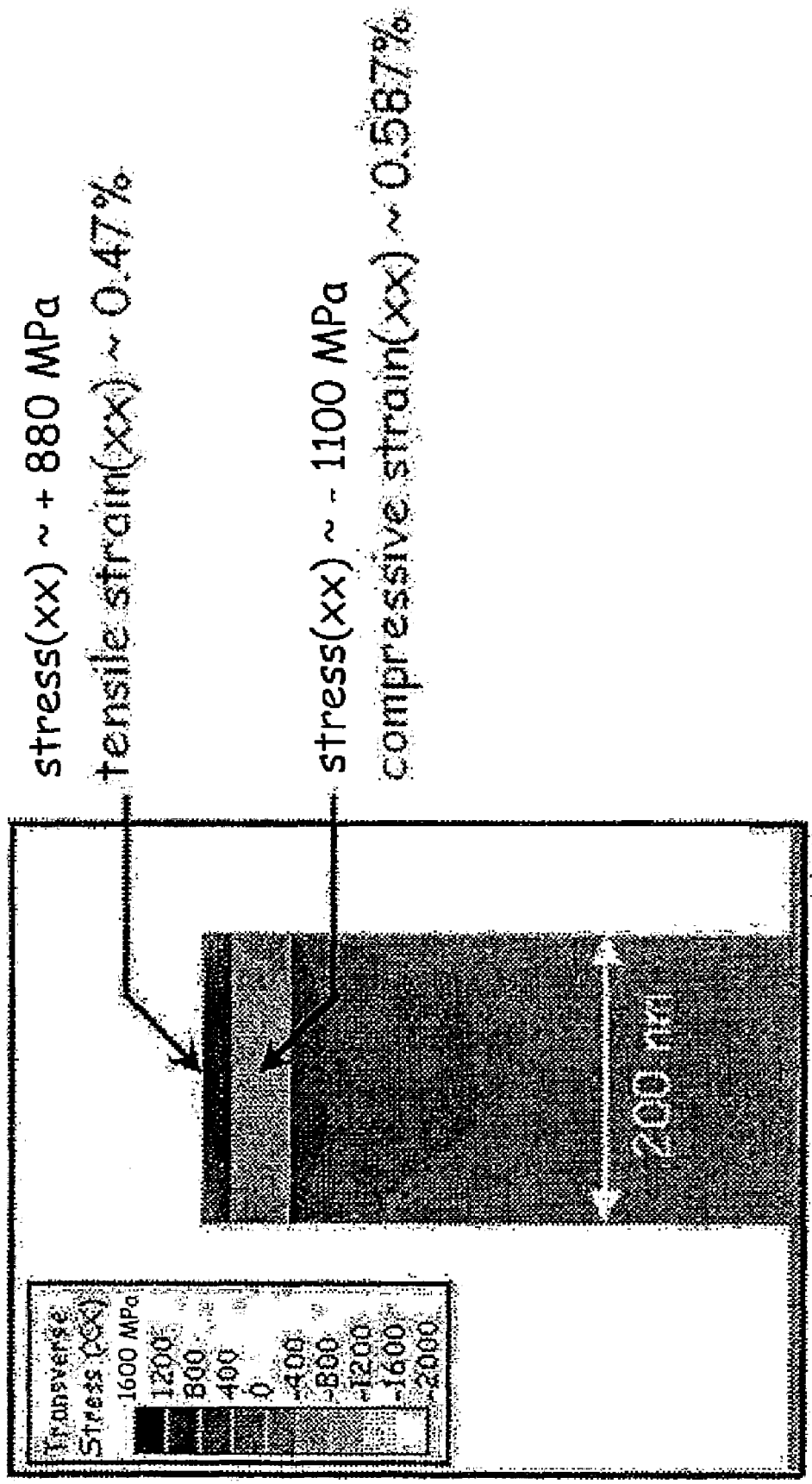
FIG. 4 shows the stress distribution for wafers consistent with FIGS. 1 and 3 after further processing consistent with FIG. 2.

FIG. 3 shows a simulation of the stress distribution for a particular implementation of the FIG. 1 heterostructure wafer, with a 40 nm silicon germanium layer 12 having 20% atomic germanium fraction and a 20 nm silicon layer 14. As formed, the SiGe layer 12 has a uniform in-plane compressive stress of −1760 MPa (a negative value indicating compressive stress according to the usual convention) and the bulk silicon substrate 10 and the silicon surface layer 14 have substantially no stress. FIG. 4 shows a further simulation in which the FIG. 3 structure has trenches etched into it with the trenches separated by 200 nm. Thus, the FIG. 4 simulation corresponds to the structure illustrated in FIG. 2 with the layer 22 having a thickness of 40 nm, width of 200 nm and 20% atomic germanium fraction and the silicon layer 24 has a thickness of 20 nm. The trenches are etched to a depth of 400 nm, which is through layers 22 and 24 and substantially into the substrate.

Figure 5:
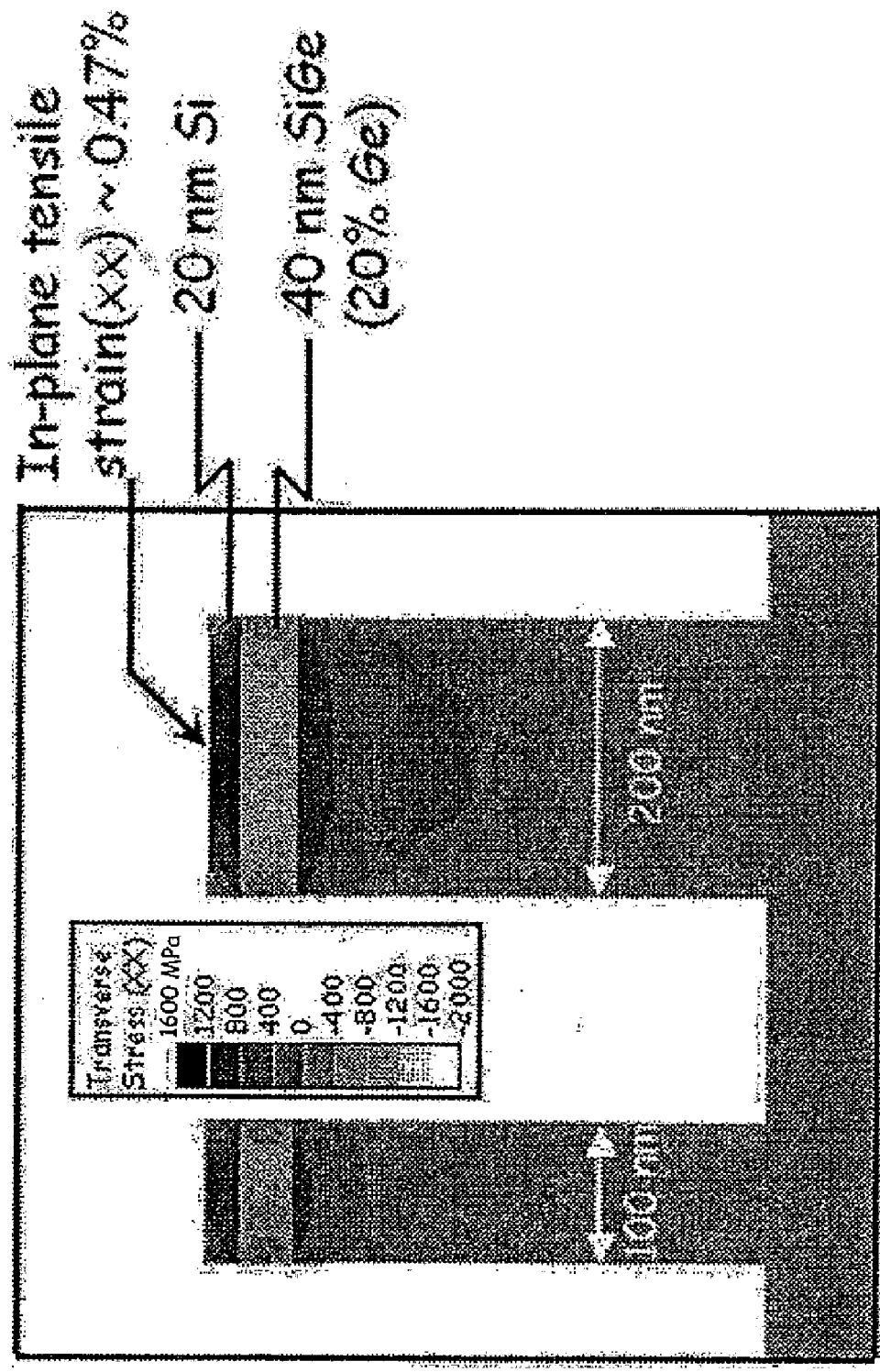
FIGS. 5 and 6 provide a comparison of the stress distribution for a strained silicon surface layer made by a process according to the present invention (FIG. 5) with a strained silicon surface layer formed using the conventional thick, relaxed silicon germanium process (FIG. 6).
Figure 6:
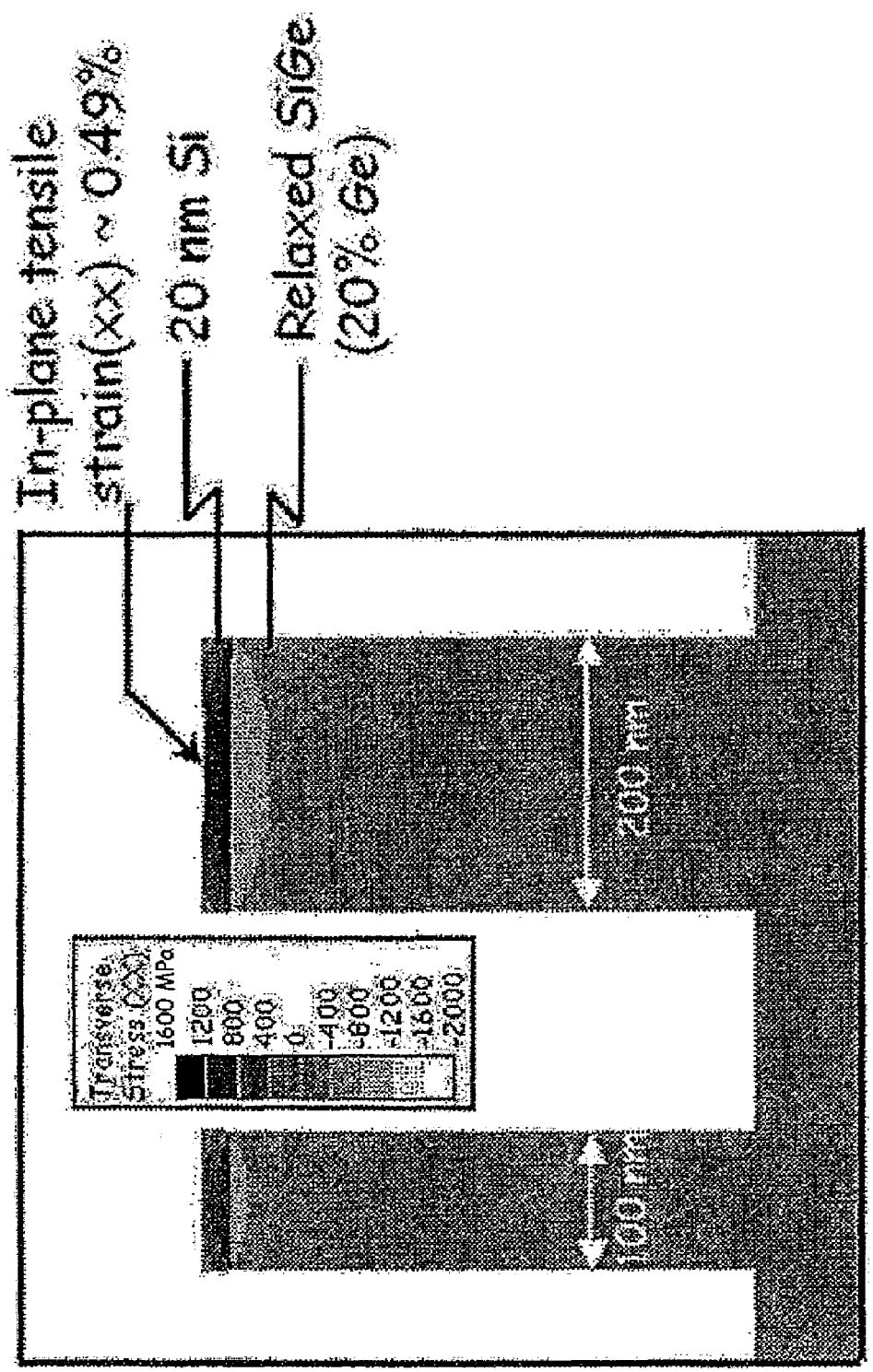

As shown in the FIG. 4 simulation, a compressive stress of −1100 MPa remains in SiGe layer 22 and a tensile stress of +880 MPa, or approximately 0.47% strain, is generated in the surface silicon layer 24. The FIG. 4 simulation shows that the trench etching creates a tensile strained surface silicon layer. The success of this process can be illustrated by comparing FIGS. 5 and 6. FIG. 5 illustrates the structure of FIG. 4 at a different scale for ease of comparison. Both FIGS. 4 and 5 illustrate a structure made in accordance with preferred aspects of the present invention. FIG. 6 shows a simulation of a heterostructure in which a thick relaxed SiGe layer, with 20% atomic germanium fraction, is formed on a bulk silicon substrate. A 20 nm silicon layer is formed in the FIG. 6 structure by depositing silicon on the thick, relaxed SiGe layer so that the silicon surface layer is formed with a tensile strain. The thick silicon SiGe layer is relaxed through elastic and plastic mechanisms so that the SiGe layer surface is heavily dislocated. The process illustrated in part in FIG. 6 produces a tensile strain in the silicon surface layer of about 0.49%.

The structures described here are described with reference to a layer or layers. As a general matter, layers are distinguished by substantial changes in composition or atomic mole fractions over a limited spatial interval. Boundaries and interfaces are not ideal and there will generally be interdiffusion and grading at the interfaces between layers. Compositions or atomic mole fractions will generally be a function of distance from the nominal interface between layers and compositions or atomic mole fractions of minority components may extend at a low level through layers as thin as those contemplated in the present structures. Different processes will produce different functions of component atomic mole fraction. When the present discussion refers to an atomic mole fraction, it is sufficient to consider the average of the atomic mole fraction of a component over the nominal thickness of the layer. As a consequence of this, a silicon layer formed adjacent to a silicon-germanium layer will invariably have some level of germanium incorporated, even if the silicon layer is intended to have no germanium. Thus, a silicon layer that is nominally free of germanium, that is with nominally zero germanium atomic mole fraction, will typically have some low but measurable germanium concentration. It should also be appreciated that, in a particular workpiece, there are expected variations in the processing and structures described here, including the thicknesses and atomic mole fractions of layers.

Remarkably, when considering the induced tensile strain in a 200 nm wide layer of silicon, a 40 nm thick strained $Si_{0.8}Ge_{0.2}$ layer, like that illustrated in FIG. 5, is approximately as effective in straining the surface silicon layer as a thick relaxed $Si_{0.8}Ge_{0.2}$ layer is in the conventional process, illustrated by FIG. 6. Because of the simpler process used in accordance with the present invention to form the FIG. 5 structure, the substantially equivalent strain distribution achieved indicates that the FIG. 5 method can provide desirable cost reductions with significantly reduced misfit dislocations and comparable advantage in improved device performance.

The strain repartitioning effect illustrated in FIGS. 4 and 5 may be explained as a change of the strain boundary condition when the trench is formed. In deposited blanket films, the laterally extended (semi-infinite) crystal lattice maintains the strain wholly in the SiGe layer (except at wafer edges). When trenches are etched, the new free surfaces cannot support a normal component of strain. Consequently, the strain is repartitioned between the component layers. The SiGe layer that had previously been held under compression relaxes laterally, giving up some of its strain energy to the surrounding (above and below) silicon lattices. The result is that a tensile strain with dominant in-plane components is induced in the adjacent silicon layers 20, 24 (FIG. 2) without generating misfit dislocations. As noted above, the strain release in the SiGe layer 22 is not expected to be complete, particularly since the silicon substrate and strained silicon surface layer 24 exert a force back against the relaxing SiGe layer 22. The term relaxed is used here to refer to a substantial level of relaxation and does not require ideal relaxation.

Preferred methods according to the invention form in-plane tensile strained silicon by elastic relaxation of heteroepitaxial Si/SiGe/Si layers. The critical thickness is not exceeded for the SiGe epitaxial layer and hence there should be no plastic relaxation involving generation of misfit dislocations.

The extent of the elastic relaxation is limited to the semiconductor regions in proximity to the etched trench, i.e., the effect is local in nature with a typical lateral range of about 50 nm-200 nm, depending on the trench depth. Deeper trench etching allows for a more complete release of the compressive strain within the SiGe layer. Preferred structures and processes according to the present invention are appropriate to the length scale and STI configurations of current and future high performance CMOS integrated devices.

The distribution of strain in the various layers following trench formation is inhomogeneous. For example, the in-plane stress component necessarily goes to zero at the new boundary established by an etched trench (stress cannot exist in the empty space of the trench and stress tensors must be continuous). The final strain distribution is therefore strongly dependent on the geometry of the layered structures, specifically: (1) the relative thicknesses of the epitaxial SiGe layer and the upper silicon layer; (2) the spacing between walls of the isolation trenches (i.e. the lateral extent of the silicon active area) and (3) the depth of the isolation trenches. In addition, a non-geometric factor, the atomic germanium fraction of the SiGe layer, is an important determinant of the strain in the system.

In general, the amount of biaxial tensile strain in the upper silicon layer may be increased by one or more of the following steps: (1) growing a thicker SiGe layer; (2) growing a thinner silicon overlayer; (3) reducing the spacing of the isolation trenches down to a lower limit beyond which the strain in the upper silicon layer starts to decline (reducing the lateral extent of the active area); (4) increasing the depth of the isolation trenches (STI) and (5) increasing the atomic germanium fraction (mole fraction or concentration) of germanium in the SiGe layer. An important constraint is that the SiGe epitaxial layer may not exceed its critical thickness for plastic strain relaxation and formation of misfit dislocations. That is, the as-deposited SiGe layer has a thickness which is less than the thickness at which plastic strain relaxation will occur and high levels of misfit dislocations appear. Equivalently, the critical thickness is that thickness for a SiGe layer in a heterostructure at which plastic deformation of the SiGe layer occurs, as indicated in part by the level of misfit dislocations increasing sharply above a minimal level of $10^3$ to $10^4$ per square centimeter. This critical thickness depends on various factors including the difference in atomic germanium fraction between the substrate (typically but not necessarily silicon) and the subsequently formed SiGe layer.

Another consideration in determining the strain within a completed device is the material used to fill the etched trenches and the processes for etching and for filling the trenches. In most conventional STI CMOS processes, the trench is first lined with a thermal oxide and then fill material (typically silicon dioxide) is deposited and, in some cases, annealed. This fill technology generally gives rise to additional compressive strain in the system which is transferred into the active layer. Linear superposition principles apply to stresses, so if the conventional STI fill scheme is employed, it will similarly impose an additional compressive component on top of the tensile strain in the silicon layer. Overall, the net strain in the active silicon layer will be more tensile. Furthermore, as is known in the art, it is possible to minimize the compressive stress induced by the STI fill process by modifying the process conditions for the liner, dielectric fill and densification anneal, when annealed.

Figure 7:
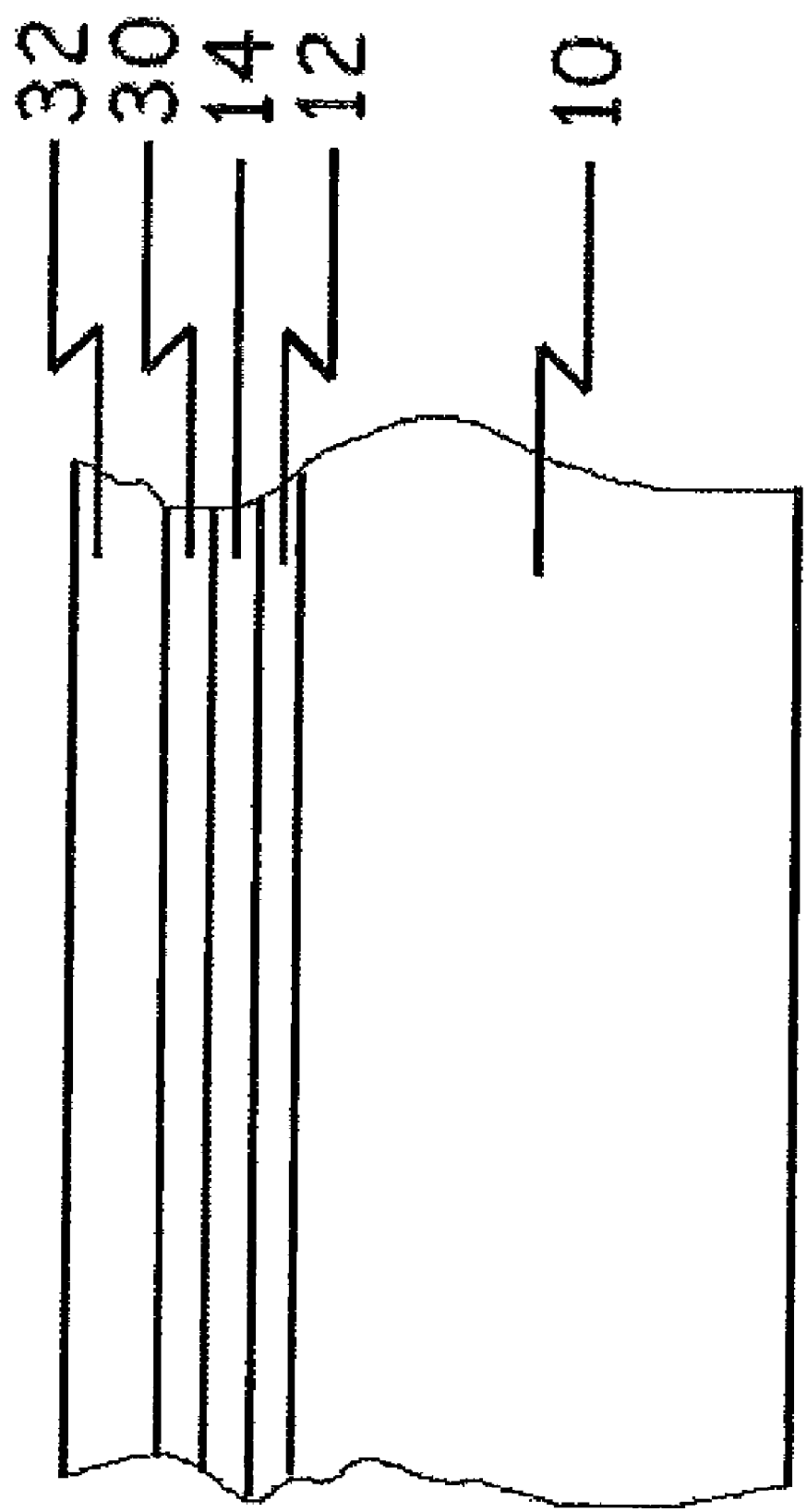
FIG. 7 illustrates the heterostructure wafer of FIG. 1 after further processing.
Figure 8:
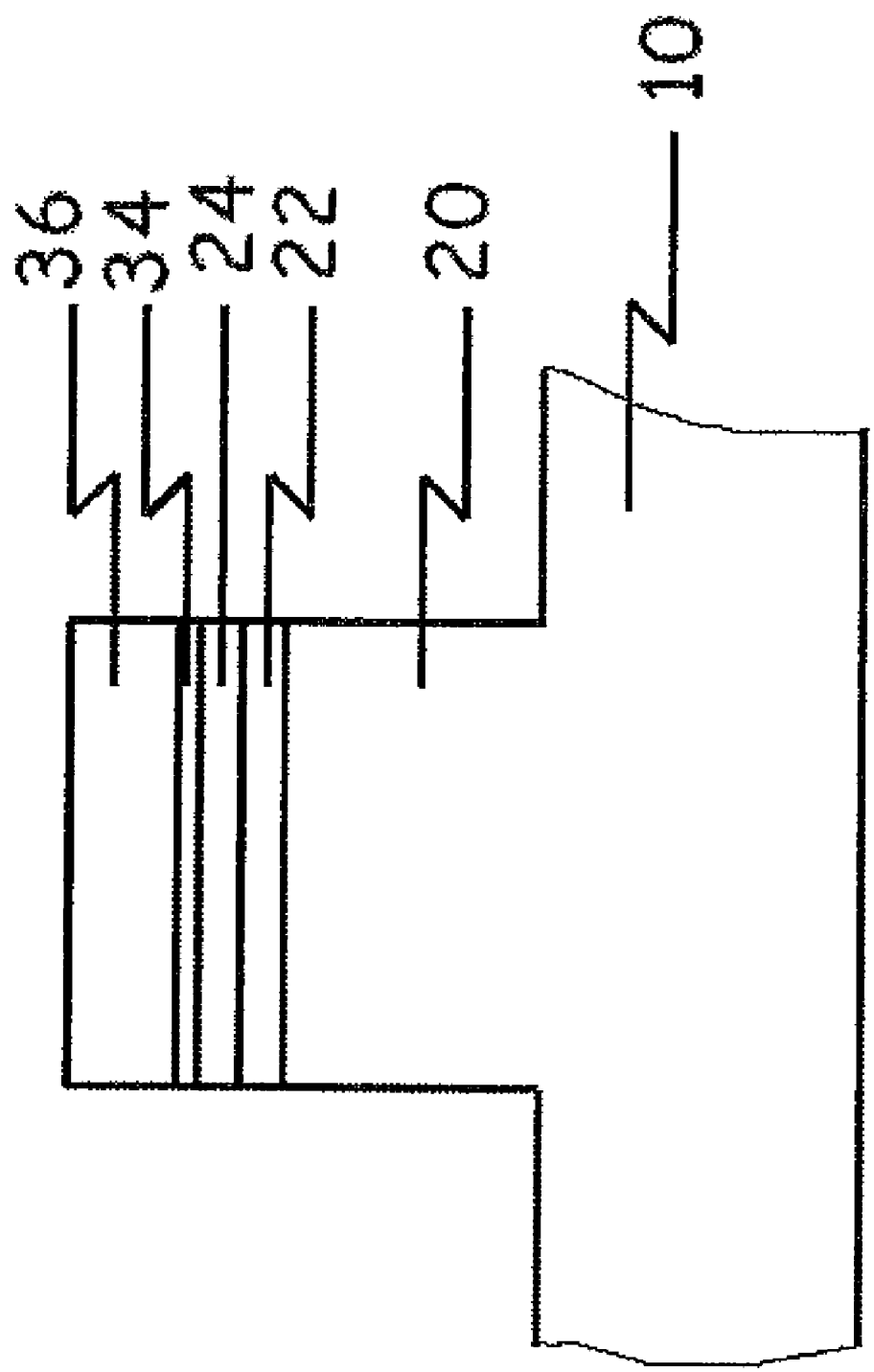
FIG. 8 illustrates the heterostructure wafer of FIG. 7 after further processing.

A preferred manufacturing process according to the present invention involves forming shallow trenches into a heteroepitaxial layer system consisting of a silicon substrate, a compressively strained pseudomorphic layer of SiGe and a thin relaxed silicon surface layer. In conventional shallow trench isolation (STI) technology, a hard mask (typically silicon nitride) is employed to pattern the trenches. Starting from the silicon substrate 10, SiGe compressively strained layer 12 and silicon surface layer 14 structure illustrated in FIG. 1, a process may proceed by forming a pad oxide layer 30, typically by thermal oxidation or chemical vapor deposition (CVD), followed by depositing a silicon nitride layer 32 by CVD in the manner illustrated in FIG. 7. Both the silicon nitride 30 and pad oxide 32 layers are patterned to form masking oxide 34 and nitride hard mask 36. Etching using the nitride mask 36 as a hard mask forms the structure illustrated in FIG. 8. The nitride mask 36 serves not only as a mask to the reactive ion etch (RIE) used to etch the trenches but also as a hard stop to the chemical mechanical polishing used to planarize the oxide that fills the trenches. Because of this, the conventional STI process leaves the patterned nitride 36 and oxide 34 mask in place.

On the other hand, leaving the nitride hard mask 36 in place may inhibit the elastic strain relief when the trenches are etched, tending to cause the compressive strain to be retained in the etched SiGe layer 22 and the surface silicon layer 24 to not be strained to a desirable extent. In especially preferred embodiments, the STI process is modified to more efficiently allow elastic strain relaxation. Possible modifications include using a nitride STI liner or a more compliant pad oxide. For example, after the STI etch is completed, the nitride hard mask can be removed. Preferably the hard mask is removed and elastic strain relaxation is allowed to take place uninhibited. Then a thinner nitride "liner" layer is deposited conformally over the STI topography. This silicon nitride liner layer is used as the polish stop for the CMP planarization used after depositing an insulator such as silicon dioxide using, for example, high density plasma chemical vapor deposition. The nitride layer is subsequently removed from the top surface of the active area by a suitable etch process and remains on the trench sidewalls and the trench bottom.

Figure 9:
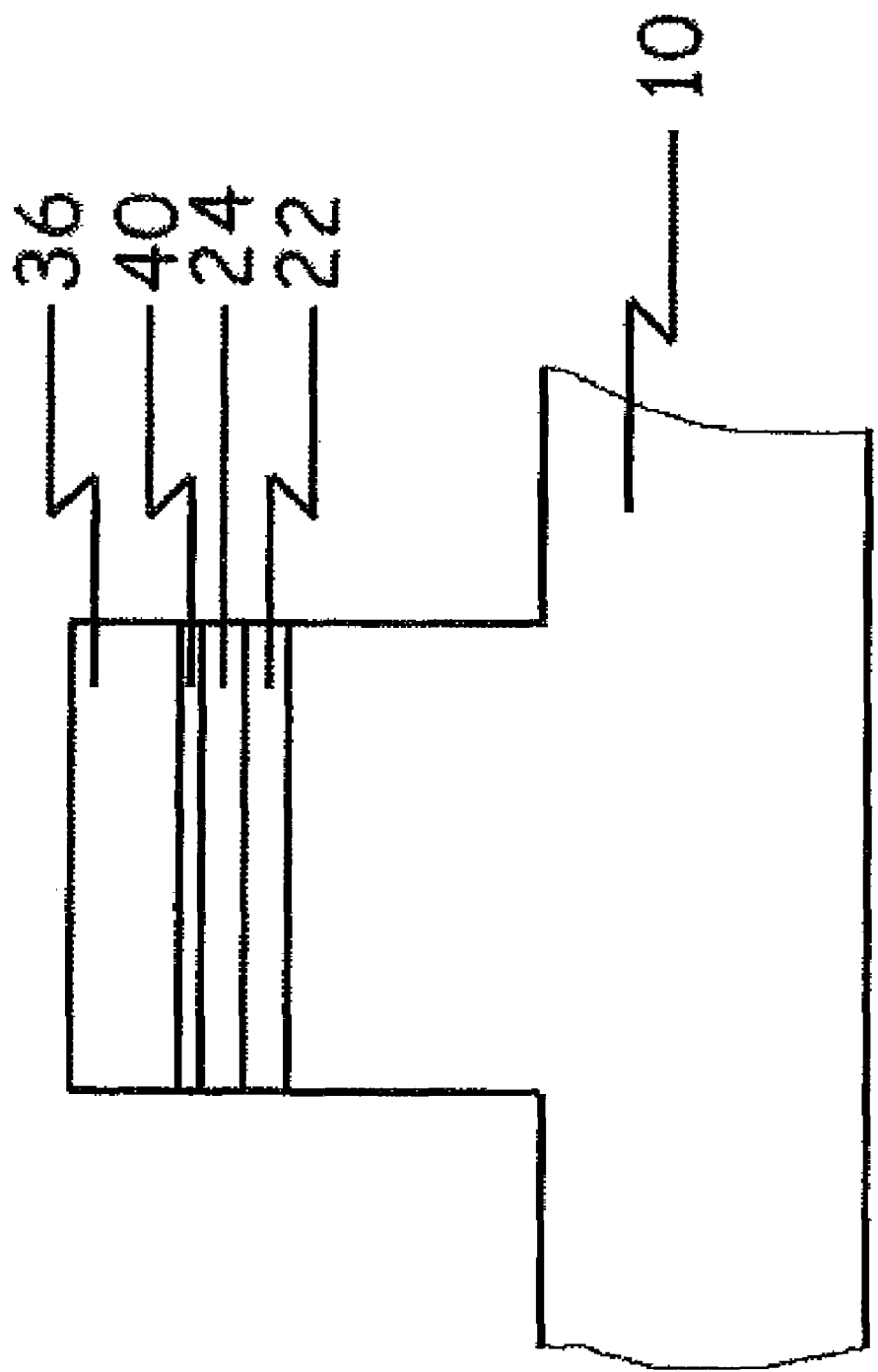
FIG. 9 illustrates an alternative process for forming a shallow trench isolation structure on the FIG. 7 wafer.

In a different strategy for decoupling the nitride layer from the surface silicon layer 24, a more compliant oxide layer, as compared to thermal oxide, can be used between the nitride hard mask and the layer 24. This variation is shown in FIG. 9. In this alternative, the nitride hard mask is deposited over a layer of oxide such as boro-phospho-silicate glass (BPSG) or other material that is or can be made desirably compliant. Patterning forms the nitride mask separated from the silicon layer 24 by a BPSG oxide or other compliant layer 40. After the trenches are etched, the nitride mask is left in place and the assembly preferably is heated to a temperature of about 800° C. or in some cases higher, for example, 850° C. and for a period of about 2 hours, which makes the BPSG compliant, allowing the silicon layer 24 to be strained and for the SiGe layer 22 strain to be relaxed elastically. Continued processing, which may be consistent with conventional STI processing, forms the STI isolation structures. Because the SiGe layer 22 has already relaxed, the subsequent filling of the trench does not prevent the relaxation of the SiGe layer 22 and the strain of the surface silicon layer 24.

Further processing is preferably performed to form n-MOSFET devices and, as desired, p-channel MOSFET (p-MOSFET) devices and CMOS circuitry. An example of an n-MOSFET device is illustrated in FIG. 10. As shown, the partially relaxed SiGe layer 22 is provided over the substrate 10 and the strained silicon surface layer 24 covers the SiGe layer 22. Gate dielectric 50 separates gate electrode 52 from the silicon surface layer 24. n-type source and drain electrodes are provided on either end of the layer 24 so that the silicon surface layer 24 acts completely or at least partially as the channel region of the illustrated n-MOSFET device. In the illustrated configuration, shallow trench isolation structures 58, 60 are formed at the ends of the source and drain regions 54, 56. The described n-MOSFET devices can be used with various types of p-MOSFET and in various CMOS devices, including ones that include p-MOSFET devices with different types of strained or unstrained active regions.

Another consideration is the different impact that the in-plane stress components have on carrier mobilities. For electrons (in n-MOSFETs) it is generally understood that tensile strain is desirable along both the length and width axes of n-MOSFETs that are aligned along <110> axes of a (100) oriented substrate. That is, for n-MOSFETs, the piezoelectric coefficients are such that mobility increases with biaxial tensile strain. However, for holes, tensile strain is only desirable along the width axis for a similarly oriented p-MOSFET and uniaxial compressive strain is desirable along the length axis in such a p-MOSFET. This has led at the 90 nm manufacturing technology node to the use of selectively grown SiGe inserts in the source and drain regions of p-MOSFETs to induce the desired uniaxial compressive strain in the silicon channel region.

For the purpose of improving the electrical performance of p-channel MOSFETs according to the present invention, it is possible to selectively remove part of the strained silicon upper layer in p-MOSFETs such that the channels of these devices are formed primarily in a layer of compressively strained SiGe. Compressively strained SiGe improves the properties of p-MOSFETs by increasing the effective channel mobility of holes. Sufficient silicon should be left after the selective removal to allow formation of a reasonably pure silicon dioxide layer to serve as the gate dielectric. For individual optimization of the p-MOSFET and n-MOSFET devices, the top strained silicon layer may be grown to an optimal thickness for maximum n-channel performance and then selectively thinned on the active areas of p-MOSFET devices by a masked growth of a sacrificial oxide layer of appropriate thickness. For p-MOSFET devices, the thinner silicon over the compressive SiGe layer ensures most of the channel hole charge is contained in the compressive SiGe layer, which can have a higher hole mobility than the overlying strained silicon.

p-MOSFET devices may benefit from forming their channels in a layer of compressively strained SiGe under the tensile strained silicon surface layer. Some degree of in-plane compressive strain remains in the layer of SiGe after the isolation trenches are formed. The magnitude and distribution of compressive strain in the SiGe layer that is directed along the width axis (transverse compressive strain) depends substantially on the separation of the isolation trenches along the width axis. Similarly, the magnitude and distribution of compressive strain in the SiGe layer that is directed along the length axis (longitudinal compressive strain) depends substantially on the separation of the trenches along the length axis. The respective amounts of transverse and longitudinal compressive strain in the SiGe layer may therefore be manipulated in the design of the transistor layout.

If it is preferable to maximize the compressive strain in the longitudinal direction for the purpose of maximizing the hole mobility in the longitudinal direction, then the p-channel transistors are preferably designed to have a greater separation of the trenches along the length axis, so as to minimize the elastic relaxation of the compressive strain in the SiGe layer along the length direction. If it is preferable to minimize the compressive strain along the transverse direction for the purpose of maximizing the hole mobility in the longitudinal direction, then the p-channel transistors are preferably designed to have a minimal separation of the trenches along the width axis so as to most effectively reduce the compressive strain in the SiGe layer along the transverse direction. If a p-channel MOSFET is desired to have minimal compressive strain in the SiGe layer along the transverse direction, but with an effective width larger than the minimum width, the desired result could be obtained by forming a multiplicity of minimum width p-channel MOSFETs configured in parallel, or equivalently a single p-channel MOSFET with a channel formed in a multiplicity of narrow, trench-bounded regions.

Preferred structures and methods according to the invention can provide a P-MOSFET device with its channel in the top layer of silicon and having the tensile stress along the width axis. Transverse stress inevitably tends towards zero magnitude at the STI edge. Thus, it is generally desirable to optimize the width of the channel, within the constraints of other layout and circuit design considerations, to maximize the fraction of the channel width over which elastic relaxation has an impact, and hence to maximize the fraction of the channel width over which the silicon has a substantial component of tensile strain directed parallel to the width axis. This principle applies generally to both n-MOSFETs and p-MOSFETs. In contrast to the n-MOSFET, for which biaxial in-plane tensile strain is preferred, for improved p-MOSFET performance, transverse uniaxial tensile strain is preferred in combination with longitudinal uniaxial compressive strain. If longitudinal uniaxial compressive stress cannot be obtained in the strained silicon channel layer, then the longitudinal component of tensile strain may at least be minimized in the p-channel MOSFETs. Longitudinal tensile strain may be minimized in p-channels by designing the p-channel MOSFETs with the spacing of their isolation trenches along the length axis being sufficiently large so as to avoid a substantial longitudinal component of tensile stress in the silicon p-channels due to the edge relaxation mechanism.

Alternative implementations of the present invention can provide uniaxial compressive stress in the top silicon layer directed along the length of the channel in a p-MOSFET while still obtaining a tensile strain in the width direction of the p-MOSFET channel. Preferred implementations may beneficially use the technique of applying compressive stress in the p-channel by growing layers of epitaxial SiGe selectively in recesses in the source and drain regions of the p-MOSFET. Since stresses are superimposed linearly, the net effect of this action is the same as in conventional compressed SiGe source/drain implementations. Thus selective SiGe source and drain insert technology may be applied efficiently in implementations of the present invention to induce a uniaxial compressive stress along the length of a p-MOSFET in much the same way as SiGe source and drain stressors (inserts) are applied in bulk silicon CMOS technology. The recessed SiGe regions are preferentially grown epitaxially on an unstrained silicon substrate in order most efficiently to impart uniaxial compressive stress to the channel region. In contrast, the effectiveness of recessed SiGe source and drain stressors may be substantially reduced if they are grown epitaxially on relaxed SiGe virtual substrates, as would be the case with conventionally manufactured epitaxial strained silicon.

In the process of etching the recesses at the ends of the p-MOSFET channels for the selectively grown epitaxial SiGe source/drain inserts, nearly all of the tensile strain directed along the length of the silicon channel will be removed by edge relaxation (assuming the gate length is very short relative to the thickness of the top silicon layer). While this should be avoided in n-channel MOSFETs, this relaxation may be favorable for p-channel (hole) mobility. According to a preferred aspect of the present invention, subsequent coherent growth of SiGe on the revealed unstrained silicon substrate will impart maximum uniaxial compressive stress in the channel. The stress induced by the recessed selectively grown SiGe source and drain insert regions will be similar to the stress induced by selectively grown SiGe source and drain insert regions in a conventional bulk silicon process if the source and drain SiGe insert regions are grown in recesses etched through to the underlying silicon substrate. This is because the SiGe source and drain insert regions induce maximum stress if they are grown coherently on a relaxed silicon template. The same would not be true for a similar process using conventional strained silicon where there is a virtual substrate of relaxed SiGe. Growing the recessed SiGe source/drain layers on a SiGe virtual substrate may not lead to maximal uniaxial compressive stress in the silicon channel. According to the present invention, on the other hand, compressive stress may be introduced using the SiGe source/drain insert technique, while retaining the advantage of tensile strain along the transverse (width) direction. It remains possible to form p-channel devices in the layer of compressively strained SiGe, as described previously. This option does not require recessed selectively grown SiGe source and drain regions.

A modification to the above-described processes can dope the layer of SiGe such that it may be employed as an electrical "ground plane." In a ground plane MOSFET, the ground plane layer is contacted and connected electrically in common with the source of the MOSFET. Ground plane MOSFETs may behave electrostatically similar to fully depleted silicon on insulator (SOI) devices where the thickness of the "virtual SOI" is twice the thickness of the silicon layer above the ground plane. In one embodiment, the epitaxial SiGe layer may be doped in-situ p-type with boron to a level of greater than $1 \times 10^{19}$ atoms per $cm^3$. Such a layer would be suitable for fabrication of the ground plane for a ground plane n-channel FET (GP-n-channel FET) with the device channel formed in the overlying strained silicon layer. For fabrication of a GP-p-channel FET, the SiGe ground plane layer would be counter-doped n-type. The counter-doping may be achieved by ion implantation of a donor species such as arsenic or phosphorous followed by a suitable anneal cycle. Due to the enhanced diffusion of arsenic and phosphorus in SiGe, if the peak of the implantation profile is located in the SiGe layer, the dopants would redistribute by diffusion at high temperatures to form an approximately rectangular pulse shaped profile colocated with the SiGe layer. The implantation dose of the donor species would be selected to obtain an approximately uniform doping concentration in the SiGe layer equal to twice the original in-situ acceptor doping concentration in that layer. In this manner, a SiGe layer which was doped in-situ p-type would be counterdoped to n-type with a net donor concentration of approximately $1 \times 10^{19}$ atoms per cm$^3$.

Either or both of the SiGe and silicon epitaxial layers may include a small percentage of carbon in the range 0%-1.0% in its composition (atomic fraction). Carbon in the silicon epitaxial layer increases the amount of tensile strain in the silicon layer, all other factors being equal. Carbon in the compressively strained Ge or SiGe layer reduces the strain in that layer but allows greater germanium mole fractions to be incorporated within the constraint of critical thickness. Carbon may also be introduced into either layer for the purpose of reducing diffusion of acceptor dopants, principally boron.

As may be seen in the simulations of stress in two dimensions, the strain induced in the surface silicon layer is inhomogeneous. In particular, the in-plane (xx in the simulations) component of stress/strain goes to zero at the edges of the active area and increases moving away from the edge. It is expected that the strain in the silicon layer returns to zero further from the edge where the system returns to being like the blanket films (i.e., with all the strain energy contained in the SiGe layer). This leads to the conclusion that the strain profile is a strong function of device geometry, including both the in-plane geometry (essentially determined by layout of the transistors) and the perpendicular geometry (epitaxial layer thicknesses and compositions and STI depth). That is, for a Si/SiGe/Si layer structure with a given set of layer thicknesses and compositions, and for a given trench depth and profile, the strain will assume a certain profile depending on the lateral active area dimensions. When considering a real three-dimensional device, the situation is complicated because of the complex interaction of lattice distortions induced along the length (L), width (W) and depth axes of the active area.

In some ways the layout dependence of strain may be seen as a problem. But this problem already exists, whether or not the industry has recognized it as a general matter. The industry has recognized the importance of STI process induced strain (e.g., due to liner oxidation and densification of the filler oxide) on device characteristics. Threshold voltage ($V_T$) and peak drain current ($I_{ON}$) are found to be dependent on layout in non-obvious ways and it is believed that STI induced strain is a major factor. Conventional strained silicon suffers from similar spatial dependence of strain due to edge relaxation. Edge relaxation may well be a root cause of a loss of performance of strained silicon MOSFETs which is observed when they are scaled to small dimensions. The simple simulations reported here indicate that epitaxial built-in strain is largely relieved when the active area dimensions are small. Edge relaxation may complicate the implementation of epitaxial strained silicon technology, but if the root mechanisms are understood, they may be employed to advantage through careful epitaxial layer structure and isolation trench engineering.

The simple picture presented above serves as an illustration of the problem of edge relaxation. As discussed, the situation is further complicated by consideration of the active area length dimension, which may be larger than width, depending on the design rules of a particular CMOS technology.

The effective active area length of a MOSFET depends on where it is located in a circuit layout. In a NAND gate, for example, the n-channel FETs may be layed out in series along a continuous active region and the longitudinal strain in the top and bottom FETs will be most affected by edge relaxation whereas the longitudinal strain in the middle FETs will be less affected. Furthermore, edge relaxation has an impact on the drain end of the FET at the top of the stack and primarily on the source end of the FET at the bottom of the stack. This is significant because, when considering its impact on drive current, mobility may be more important at the source of a transistor than at the drain. Most preferably the geometry and other effects are taken into account in the layout design of CMOS devices employing strained silicon technology.

Implementing the structures and processes described here can provide a number of benefits, including an absence of misfit dislocations in the layers, or at least a major reduction in misfit dislocations, which leads to negligible generation of threading dislocation defects in the epitaxial silicon layer in which active devices will be fabricated. Higher yields due to reduced variability in device performance are expected. The structures and methods described here do not require a thick relaxed SiGe layer. Avoiding use and formation of a thick relaxed SiGe layer can significantly reduce the cost of wafer manufacture. Not using a thick SiGe layer also improves thermal conduction to the bulk substrate compared to the conventional thick SiGe, "Virtual substrate" technology. Reduced active device self-heating is expected.

The present invention has been described in terms of certain preferred embodiments. Those of ordinary skill in the art will appreciate that various modifications and alterations could be made to the specific preferred embodiments described here without varying from the teachings of the present invention. Consequently, the present invention is not intended to be limited to the specific preferred embodiments described here but instead the present invention is to be defined by the appended claims.

I claim:

1. A semiconductor device comprising at least one n-channel MOS field effect transistor and a substrate, the substrate comprising silicon, each of the n-channel MOSFETs comprising:

a first layer comprising germanium formed over the substrate, the first layer having a thickness less than a first thickness at which misfit dislocations form in the first layer, the first layer having a first lower interface in-plane lattice spacing matched with a substrate interface lattice spacing characteristic of an interface region of the substrate;

a second layer comprising silicon formed over the first layer, the second layer having a second layer thickness, the second layer having a second lower interface in-plane lattice spacing matched with a first layer upper interface in-plane lattice spacing characteristic of an upper interface of the first layer; and a gate dielectric layer on the second layer and separating the second layer from a gate electrode, wherein a concentration of germanium in the first layer is greater than a concentration of germanium in the second layer, the first layer and the second layer having a lateral extent along one direction such that the second layer exhibits in-plane tensile strain over all of the lateral extent through edge relaxation.

2. The device of claim 1, wherein the germanium atomic fraction of the first layer is 20% or more larger than the germanium atomic fraction of the second layer.

3. The device of claim 1, wherein the germanium atomic fraction of the first layer is between about 20% and 100%.

4. The device of claim 3, wherein the germanium atomic fraction of the second layer is about 0%.

5. The device of claim 1, wherein the lateral extents of the first layer and the second layer are defined by first and second walls of one or more shallow trench isolation structures, each of the first and the second walls extending through the second layer and the first layer and the one or more shallow trench isolation structures comprising insulating material, the lateral extent of the first layer extending between the first and second walls.

6. The device of claim 5, wherein the lateral extent of the first layer along the length axis or the width axis of the MOSFET is less than 200 nm.

7. The device of claim 5, wherein at least the second layer has a second lateral extent extending between a source and a drain region of the NMOS device.

8. The device of claim 5, wherein the one or more shallow trench isolation structures extend into the substrate by a depth equal to or greater than a distance of the lateral extent.

9. The device of claim 1, further comprising at least one p-channel MOS field effect transistor having a source region and a drain region, the source and drain regions adapted to apply compressive stress to the channel of the p-channel MOS field effect transistor.

10. The device of claim 9, wherein the source and drain regions comprise silicon germanium.

11. The device of claim 9, wherein the source and drain regions comprise silicon germanium above and in contact with an unstrained surface within the substrate.

12. The device of claim 1, wherein the second layer has a strain of at least 0.47%.

13. The device of claim 12, wherein the one or more shallow trench isolation structures extend into the substrate by a depth equal to or greater than a distance of the lateral extent.

14. A semiconductor device comprising at least one n-channel MOSFET, the semiconductor device comprising:

a substrate comprising silicon and having first and second walls of one or more shallow trench isolation structures extending partially into the substrate, a substrate interface region extending from the first wall to the second wall;

a first layer comprising germanium on the substrate interface region, the first layer extending for a first spacing between the first and second walls, the first layer having a thickness less than a first thickness at which misfit dislocations form in the first layer due to a lattice mismatch between the first layer and the substrate;

a second layer comprising silicon formed on the first layer, the second layer extending between the first and second walls; and a gate dielectric layer on the second layer separating the second layer from a gate electrode so that the second layer provides at least a part of a channel of an n-channel MOSFET device, wherein a concentration of germanium in the first layer is greater than a concentration of germanium in the second layer, and wherein the first spacing is such that the first layer induces a strain in the substrate interface region and in the second layer over an extent of the first spacing.

15. The device of claim 14, wherein the first spacing is a constant for that portion of the first layer beneath the channel region.

16. The device of claim 14, wherein the at least partial relaxation within the first layer is non-uniform over the extent of the first spacing and the strain in the second layer is non-uniform over an extent between the first and second shallow trench isolation structures.

17. The device of claim 14, wherein the first layer has a constant germanium atomic fraction over the thickness of the first layer.

18. The device of claim 17, wherein the concentration of germanium in the first layer is between 20% and 100%.

19. The device of claim 18, wherein the germanium atomic fraction of the second layer is about 0%.

20. The device of claim 14, further comprising a source region and a drain region, the second layer extending between the source and the drain regions.

21. The device of claim 14, further comprising at least one p-channel MOS field effect transistor having a source region and a drain region, the source and drain regions adapted to apply compressive stress to the channel of the p-channel MOS field effect transistor.

22. The device of claim 21, wherein the source and drain regions comprise silicon germanium.

23. The device of claim 21, wherein the source and drain regions comprise silicon germanium and are above and in contact with an unstrained surface within the substrate.

24. The device of claim 14, wherein the one or more shallow trench isolation structures extend into the substrate by a depth equal to or greater than a distance of the first spacing.

25. The device of claim 14, wherein the second layer has a strain of at least 0.47%.

* * * * *